(12) United States Patent
Morris, III et al.

(10) Patent No.: US 9,695,037 B2
(45) Date of Patent: Jul. 4, 2017

(54) MEMS DIE AND METHODS WITH MULTIPLE-PRESSURE SEALING

(71) Applicant: wiSpry, Irvine, CA (US)

(72) Inventors: Arthur S. Morris, III, Raleigh, NC (US); Dana DeReus, Santa Ana, CA (US)

(73) Assignee: WISPRY, INC., Irvine, CA (US)

( * ) Notice: Subject to any disclaimer, the term of this patent is extended or adjusted under 35 U.S.C. 154(b) by 0 days.

(21) Appl. No.: 14/881,946

(22) Filed: Oct. 13, 2015

(65) Prior Publication Data

US 2016/0096723 A1    Apr. 7, 2016

Related U.S. Application Data

(62) Division of application No. 13/928,064, filed on Jun. 26, 2013, now Pat. No. 9,156,683.

(Continued)

(51) Int. Cl.
*H01L 29/84* (2006.01)
*B81B 7/00* (2006.01)
(Continued)

(52) U.S. Cl.
CPC .............. *B81B 7/0041* (2013.01); *B81B 7/02* (2013.01); *B81C 1/00277* (2013.01);
(Continued)

(58) Field of Classification Search
CPC .................. H01L 24/11; H01L 31/048; B81C 2203/0145; B81C 2203/019; B81C 1/00293; B81C 1/00158; B81C 2201/019; B81B 2201/0235; B81B 3/0018; B81B 7/0077; B81B 2207/012; B81B 2201/0257; B81B 2201/0271; B81B 7/0006;
(Continued)

(56) References Cited

U.S. PATENT DOCUMENTS 5,531,121 A    7/1996  Sparks et al.
7,159,459 B2   1/2007  Gogoi
(Continued)

FOREIGN PATENT DOCUMENTS

WO    WO 2014/004700    1/2014

OTHER PUBLICATIONS

International Search Report and Written Opinion for Application No. PCT/US2013/047942 dated Sep. 25, 2013.
(Continued)

*Primary Examiner* — Sonya D McCall Shepard
(74) *Attorney, Agent, or Firm* — Jenkins, Wilson, Taylor & Hunt, P.A.

(57) ABSTRACT

The present subject matter relates to systems and methods for sealing one or more MEMS devices within an encapsulated cavity. A first material layer can be positioned on a substrate, the first material layer comprising a first cavity and a second cavity that each have one or more openings out of the first material layer. At least the first cavity can be exposed to a first atmosphere and sealed while it is exposed to the first atmosphere while not sealing the second cavity. The second cavity can then be exposed to a second atmosphere that is different than the first atmosphere, and the second cavity can be sealed while it is exposed to the second atmosphere.

6 Claims, 6 Drawing Sheets

Related U.S. Application Data

(60) Provisional application No. 61/664,479, filed on Jun. 26, 2012.

(51) Int. Cl.
 *B81C 1/00* (2006.01)
 *B81B 7/02* (2006.01)

(52) U.S. Cl.
 CPC .. *B81C 1/00293* (2013.01); *B81C 2203/0136* (2013.01); *B81C 2203/0145* (2013.01)

(58) Field of Classification Search
 CPC ... B81B 7/0022; B81B 7/0035; B81B 7/0041; B81B 7/0045; B81B 7/0048; B81B 7/0051; B81B 7/0054; B81B 7/04
 USPC ............... 257/414–419; 438/48–55
 See application file for complete search history.

(56) References Cited

U.S. PATENT DOCUMENTS

| | | |
|---|---|---|
| 7,659,150 B1 | 2/2010 | Monadgemi et al. |
| 8,058,144 B2 | 11/2011 | Bhagavat et al. |
| 8,216,882 B2 | 7/2012 | Lin et al. |
| 9,156,683 B2 | 10/2015 | Morris, III et al. |
| 2011/0121412 A1* | 5/2011 | Quevy .................. B81B 7/02 257/415 |
| 2012/0326248 A1 | 12/2012 | Daneman et al. |

OTHER PUBLICATIONS

Restriction Requirement for U.S. Appl. No. 13/928,064, dated Sep. 4, 2014.

Non-Final Office Action for U.S. Appl. No. 13/928,064, dated Jan. 6, 2015.

Notice of Allowance for U.S. Appl. No. 13/928,064, dated Jun. 5, 2015.

* cited by examiner

MEMS DIE AND METHODS WITH MULTIPLE-PRESSURE SEALING

PRIORITY CLAIM

This application is a divisional of and claims priority to U.S. patent application Ser. No. 13/928,064 filed Jun. 26, 2013 which claims the benefit of U.S. Provisional Patent Application Ser. No. 61/664,479, filed Jun. 26, 2012, the disclosures of which are incorporated herein by reference in their entirety.

TECHNICAL FIELD

The subject matter disclosed herein relates generally to micro-electro-mechanical systems (MEMS). More particularly, the subject matter disclosed herein relates to systems and methods for sealing one or more MEMS devices within an encapsulated cavity.

BACKGROUND

To protect micro-electro-mechanical systems (MEMS) devices from interference and damage and to establish a consistent operating environment, MEMS devices are often encapsulated within sealed cavities. Specifically, for example, a MEMS device can be sealed within a cavity having a predetermined pressure selected to improve the performance and/or increase the operation lifetime of the device. In addition, it can be desirable and sometimes required to hermetically seal a MEMS device within its cavity to prevent the egress of water into the cavity.

Despite such advantages to performance, reliability, and/or operating lifetime enabled by encapsulating MEMS devices in this way, however, the die configurations and methods used to create such encapsulation of devices are generally expensive, require a large number of processing steps, and/or result in an undesirably bulky device. These deficiencies can be further exaggerated where it is desired to seal different cavities with different environments therein (e.g., different pressures). As a result, it would be desirable for systems and methods to more efficiently allow the environment within one or more sealed cavities to be controlled.

SUMMARY

In accordance with this disclosure, systems and methods for sealing one or more MEMS devices within an encapsulated cavity are provided. In one aspect, a method for producing a micro-electro-mechanical systems (MEMS) die is provided. The method can include positioning a first material layer on a substrate, the first material layer comprising a first cavity and a second cavity that each have one or more openings out of the first material layer. At least the first cavity can be exposed to a first atmosphere and sealed while it is exposed to the first atmosphere while not sealing the second cavity. The second cavity can then be exposed to a second atmosphere that is different than the first atmosphere, and the second cavity can be sealed while it is exposed to the second atmosphere.

In another aspect, micro-electro-mechanical systems (MEMS) die is provided. The MEMS die can comprise a substrate and a first material layer positioned on the substrate, the first material layer comprising a first cavity and a second cavity that each have one or more openings out of the first material layer. A lid layer can be positioned on the first material layer, the lid layer enclosing the first cavity and the second cavity, the first cavity defining a first atmosphere therein, and the second cavity defining a second atmosphere therein that is different than the first atmosphere.

In yet another aspect, micro-electro-mechanical systems (MEMS) die can include a substrate and a first material layer positioned on the substrate, the first material layer comprising a first cavity and a second cavity that each have one or more openings out of the first material layer. A lid layer can be positioned on the first material layer, the lid layer comprising first vent holes in communication with the first cavity and second vent holes in communication with the second cavity. A first sealing layer can be deposited on the lid layer for sealing the first vent holes, and a second sealing layer deposited on the lid layer and the first sealing layer, the second sealing layer sealing the second vent holes.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides configurations for a micro-electro-mechanical systems (MEMS) die and methods for producing such a MEMS die in which different cavities on the same die/wafer can be sealed at different process steps. This progressive sealing can allow for the different cavities to be sealed in different processing environments (e.g., PECVD pressures, various sub-atmospheric processes) or to exhibit different desired operating environments. Alternatively or in addition, such sequential sealing can also provide further advantages such as selectively sealing only a portion of an array of holes in a lid layer, thereby allowing encapsulated devices contained beneath the selectively sealed holes to be protected from later material deposition steps. In addition, such progressive sealing can involve selective design of vent hole size and density, thereby allowing greater control over release etch timing, minimizing device changes within sealed cavities, and it can generally improve the control over the sealing process and improve the robustness of the completed devices by preventing the development of defects, increasing stiffness, and allowing careful control of species transport. These and other advantages will be discussed further in detail below.

Figure 1A:
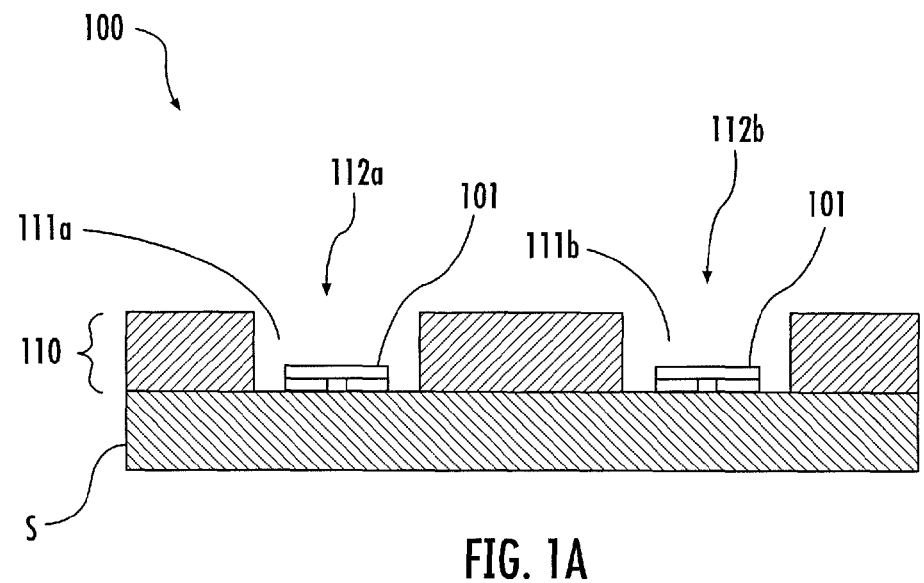
FIGS. 1A through 1F are side cutaway views of representative process steps in a method for producing a micro-electro-mechanical systems (MEMS) die according to an embodiment of the presently disclosed subject matter.

In one aspect, for example, the present subject matter provides a method for producing a micro-electro-mechanical systems (MEMS) die, generally designated 100. As shown in FIG. 1A, the method can involve positioning a first material layer 110 on a substrate S. In addition, the first material layer 110 can be composed of a single material layer (e.g., formed in one deposition step) as indicated in FIGS. 1A through 1F, or the first material layer 110 can comprise multiple material layers and/or a composite of multiple layers and materials positioned on the substrate S. In particular, for example, one or more MEMS devices 101 can be formed, deposited, or otherwise positioned on the substrate S, and the first material layer 110 can define a surrounding structure that at least partially protects and encapsulates the MEMS devices.

Specifically, the first material layer 110 can be configured to define at least a first cavity 111a and a second cavity 111b that each have one or more openings 112a and 112b, respectively, out of the first material layer 110. Of course, although only two cavities are shown in FIGS. 1A through 1F, the first material layer 110 can further include any number of additional cavities as desired for the MEMS die 100. In this configuration, one or more MEMS devices 101 can be positioned in either or both of the first cavity 111a and/or the second cavity 111b.

Figure 1B:
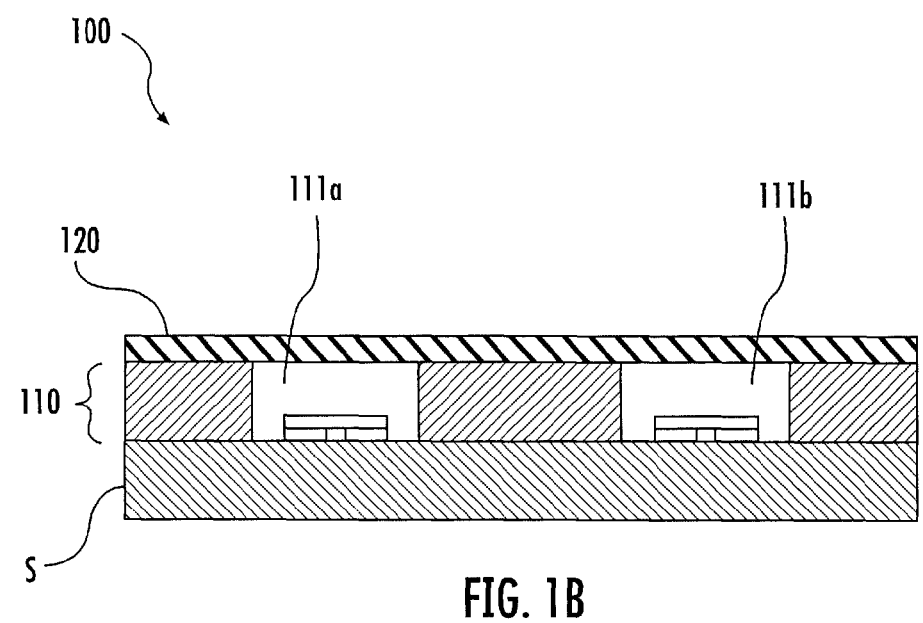
Figure 1C:
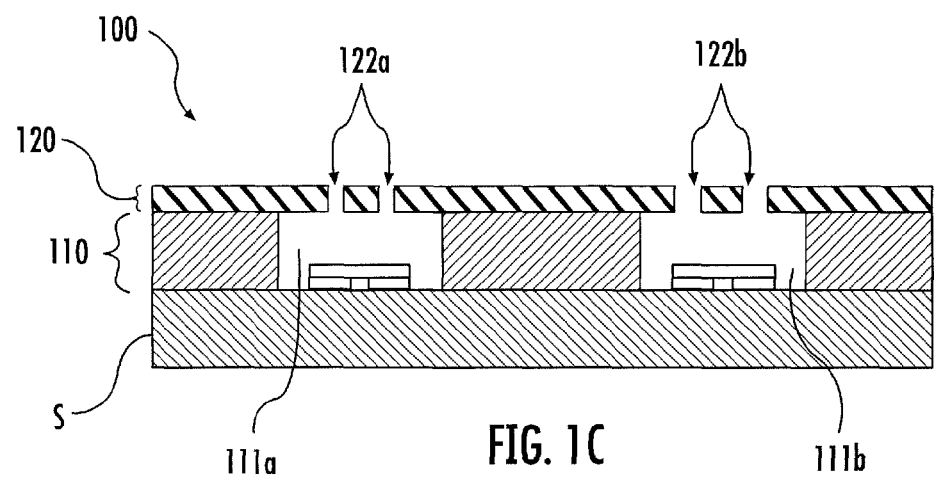

The method for producing the MEMS die 100 can further comprise, while the first cavity 111a is exposed to a first atmosphere, sealing the first cavity 111a but leaving the second cavity 111b unsealed. For example, this first atmosphere can define a particular pressure, gas composition, or other parameter associated with either a desired processing condition or a desired eventual operating environment. As shown in FIG. 1B, one way to perform this selective sealing of the first cavity 111a can be to cover the first material layer 110 with a lid layer 120. For example, the lid layer 120 can comprise plasma-enhanced chemical vapor deposition (PECVD) oxide (e.g., TEOS/Silane), PECVD nitride, physical vapor deposition (PVD) oxide, PECVD oxynitride, Alumina, amourphous silicon, or combinations thereof, although those having skill in the art will recognize that other suitable materials can be used. Then, as shown in FIG. 1C, first vent holes 122a can be etched or otherwise formed in the lid layer 120 in communication with the first cavity 111a, and second vent holes 122b can similarly be etched or otherwise formed in the lid layer 120 in communication with the second cavity 111b. Alternatively, the lid layer 120 can comprise one or more micro-electro-mechanical systems (MEMS) devices that are deposited on the first material layer 110 to at least partially cover the first and second cavities 111a and 111b.

To achieve progressive sealing of the multiple cavities, each of the lid vent holes can be sized to correspond to a particular manufacturable release etch process. Specifically, for example, the lid vent holes can be sized to seal at different stages of a multi-stage sealing process (e.g., during PECVD, during SA oxide, etc.). As a result, the size of the lid vent holes and/or the thickness of the lid layer partitioning between PECVD oxide/nitride and SA oxide processes can be selected to control the stage in the process in which each vent hole is sealed.

In this regard, the first vent holes 122a can be configured to be smaller than the second vent holes 122b. For example, the first vent holes 122a can each have a first diameter that is greater than $\frac{1}{10}$ a thickness of the first material layer 110 but less than the thickness of the first material layer 110, whereas the second vent holes 122b can each have a second diameter that is less than or equal to a thickness of the first material layer. In one particular embodiment, for instance, where the lid layer 120 has a thickness of between about 2 µm and 4 µm, the first vent holes 122a can be sized to be about 1 µm wide, and the second vent holes 122b can be about 1.5 µm wide.

Figure 1D:
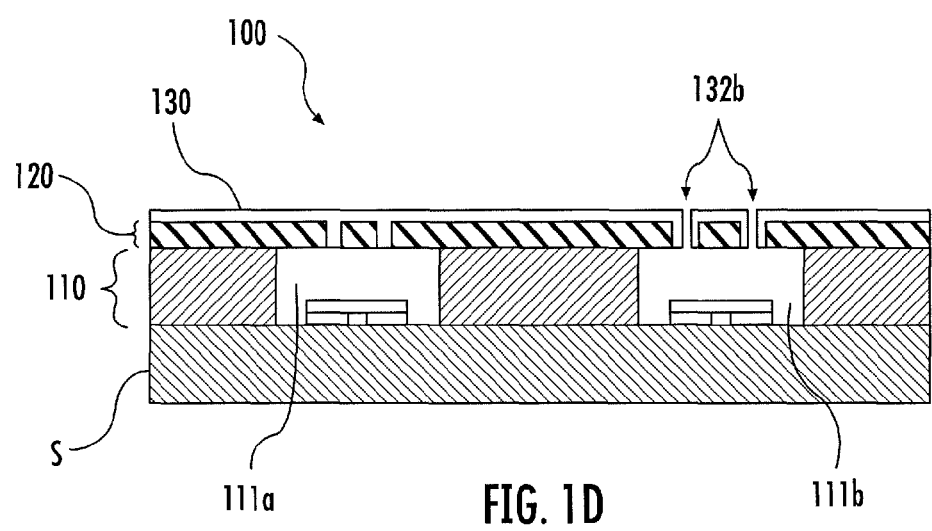

Regardless of the particular relative sizing of the vent holes, sealing the first cavity 111a can involve sealing the first vent holes 122a while the first cavity 111a is exposed to the first atmosphere. For example, sealing the first vent holes 122a can involve covering the lid layer 120 with a first sealing layer 130 designed to at least substantially fill the first vent holes 122a without completely filling the second vent holes 122b. For instance, the first sealing layer 130 can have a thickness that is at least as great as a radius of the first vent holes 122a (but is smaller than a radius of the second vent holes 122b). In one particular configuration, this first sealing layer 130 can be a first oxide and/or nitride layer that is deposited on the lid layer 120 using a plasma-enhanced chemical vapor deposition (PECVD) process. Regardless of the specific process by which the first vent holes 122a are sealed, however, the first sealing layer 130 can be configured to only partially seal the second vent holes 122b, thereby leaving one or more partially-sealed openings 132b in communication with the second cavity 111b as shown in FIG. 1D.

Once the first cavity 111a is sealed, the atmosphere defined therein is substantially the atmosphere to which the first cavity 111a was exposed during the sealing process. Then, the atmosphere within the first cavity 111a will be insulated from any changes in the surrounding environment. As a result, at least the second cavity 111b can be exposed to a second atmosphere (i.e., through partially-sealed openings 132b) that is different than the first atmosphere without changing the environment within the first cavity 111a. For example, where the first atmosphere defined a first pressure, the second atmosphere can define a second pressure that is different than the first pressure. The second cavity 111b can be sealed while the second cavity 111b is exposed to this second atmosphere.

Figure 1E:
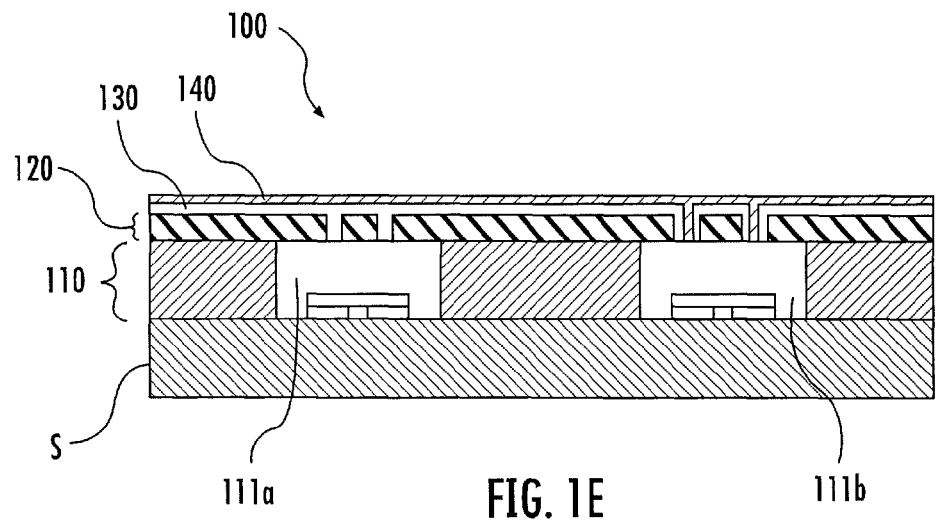

Referring to FIG. 1E, for example, sealing second cavity 111b can involve completely sealing the second vent holes 122b (i.e., sealing the remainder of partially-sealed openings 132b) while the second cavity 111b is exposed to the second atmosphere. In particular, sealing the second vent holes 122b can be accomplished by covering the lid layer 120 with a second sealing layer 140 configured to at least substantially fill the second vent holes 122b. In this regard, the second sealing layer 140 can be deposited over the lid layer 120 and the first sealing layer 130. In one particular embodiment, for example, the second sealing layer 140 can be a second oxide layer, which can be deposited using a sub-atmospheric chemical vapor deposition process. Other exemplary embodiments of the second sealing layer 140 can include spin-on polymer (e.g., polyimide, benzocyclobutene (BCB), SiLK™), spin-on glass, AID alumina, or other material that can be used to fill and plug the partially-sealed openings 132b.

Figure 1F:
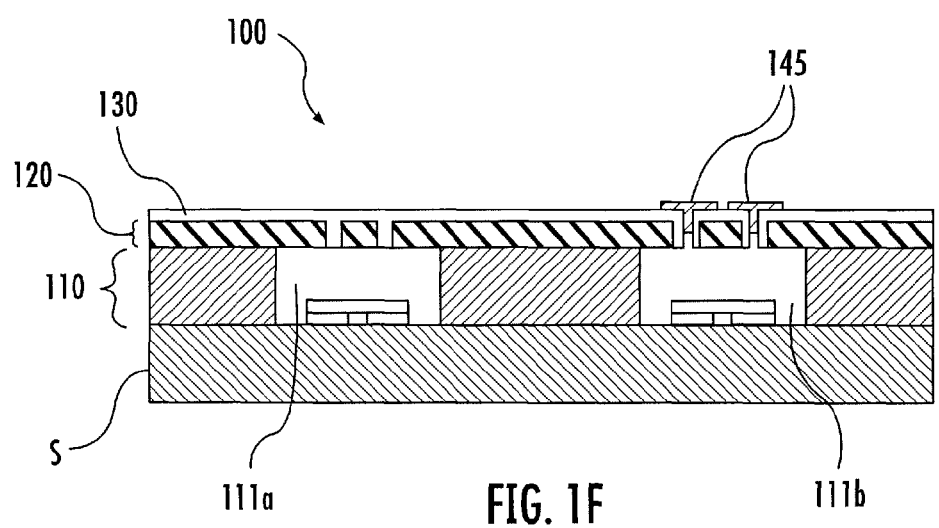

Alternatively, rather than covering the entirety of the lid layer 120 and the first sealing layer 130 as shown in FIG. 1E, the first sealing layer 130 can be further patterned or otherwise modified to reduce the amount of sealing material in the encapsulation structure, which can help alleviate the stresses that can develop. In this regard, as shown in FIG. 1F, at least portions of the second sealing layer 140 can be removed from the MEMS die 100 except for the places where it seals the second vent holes 122b, thus leaving an array of plugs 145 corresponding to the array of second vent holes 122b. In this way, the plugs 145 of the second sealing layer 140 prevent other materials from entering the second cavity 111b but do not completely cover the top surface of the first sealing layer 130.

Figure 2:
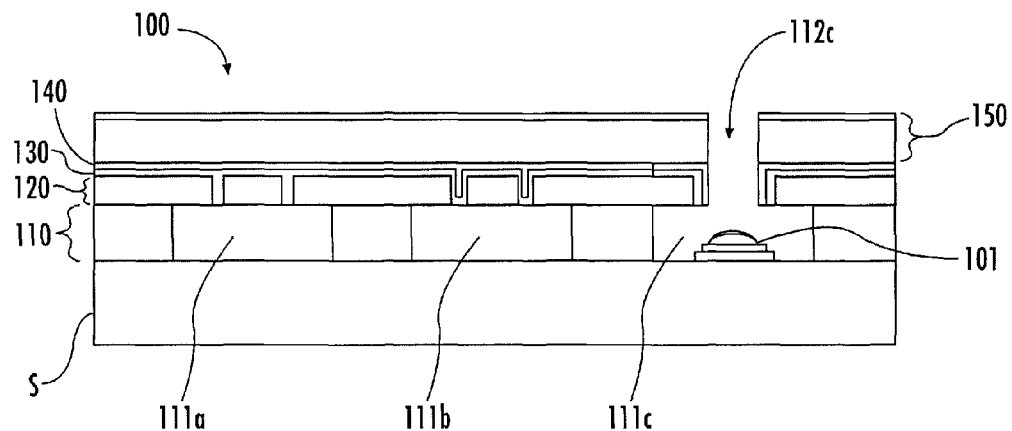
FIG. 2 is a side cutaway view of a micro-electro-mechanical systems (MEMS) die according to another embodiment of the presently disclosed subject matter.

With both the first cavity 111a and the second cavity 111b sealed, one or more additional material layer 150 (e.g., and additional lid layer) can be provided to cover one or more of the first sealing layer 130 or the second sealing layer 140 as shown in FIG. 2. For example, the one or more additional material layer 150 can be one or more of a silicon dioxide layer or a silicon nitride layer, ALD alumina, ALD silicon oxide, polymer (polyimide, BCB, epoxy), SOG, Aluminum, Cu, TiN, Ti, TiOx or other common IC materials. Although the one or more additional material layer 150 is shown only in FIG. 2, those having skill in the art will recognize that such additional material layers can be provided in any of a variety of configurations of a MEMS die 100 (e.g., including those configurations shown in FIGS. 1A through 1F).

In this way, the MEMS die 100 can contain, in its completed form, at least two different cavities that exhibit different internal environments. In addition, although FIGS. 1A through 1F illustrate steps of sequentially sealing two different cavities, which can be exposed to two different environments, those having skill in the art will recognize that the concepts discussed herein can be extended to sealing a plurality of cavities during each sealing step (e.g., multiple cavities being sealed under the conditions discussed for sealing the first cavity 111a). Alternatively or in addition, one or more additional cavities having one or more openings out of the first material layer 110 can be sealed under additional environmental conditions, which can be the same as or different from one or both of the first atmosphere and the second atmosphere. In addition, as shown in FIG. 2 for example, a third cavity 111c can be provided in the first material layer 110 that remains unsealed following the steps of sealing the first cavity 111a and sealing the second cavity 111b, leaving a third opening 112c allowing communication with the interior of the third cavity 111c.

Figure 3A:
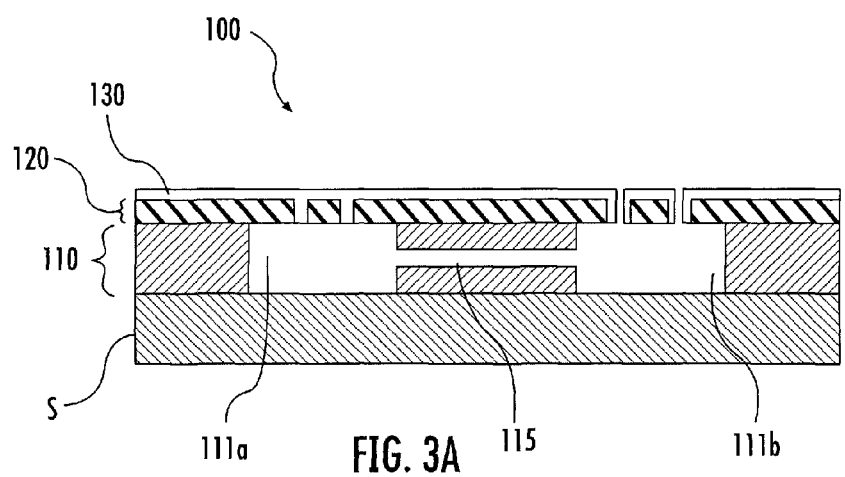
FIG. 3A is a side cutaway view of a micro-electro-mechanical systems (MEMS) die according to yet another embodiment of the presently disclosed subject matter.
Figure 3B:
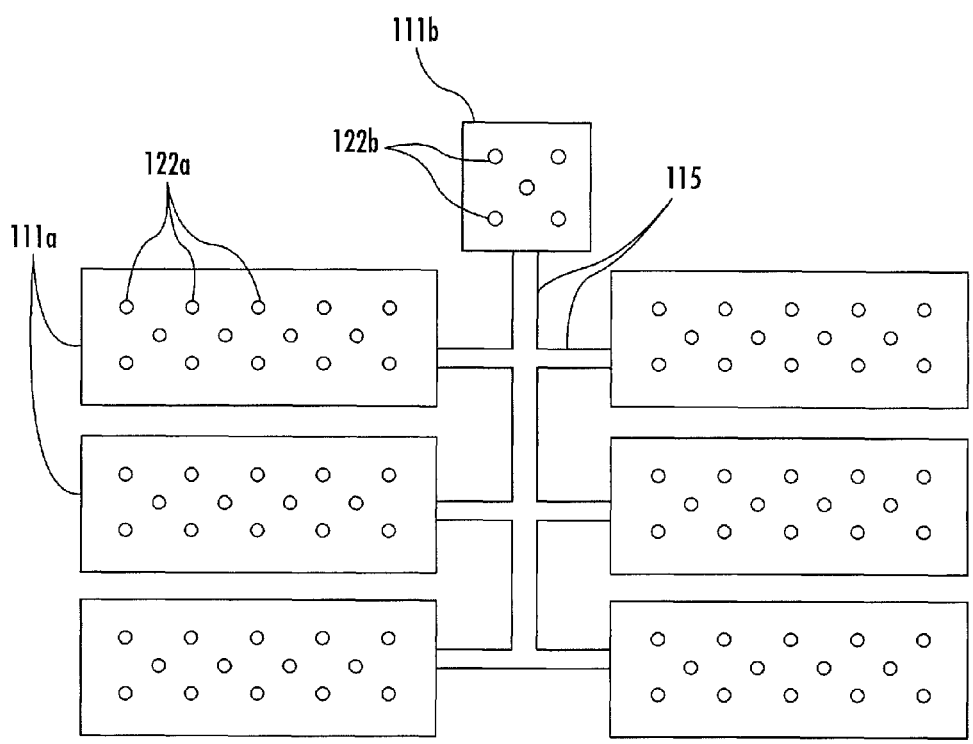
FIGS. 3B and 3C are plan views of exemplary arrangements of device cavities within a MEMS die according to embodiments of the presently disclosed subject matter.
Figure 3C:
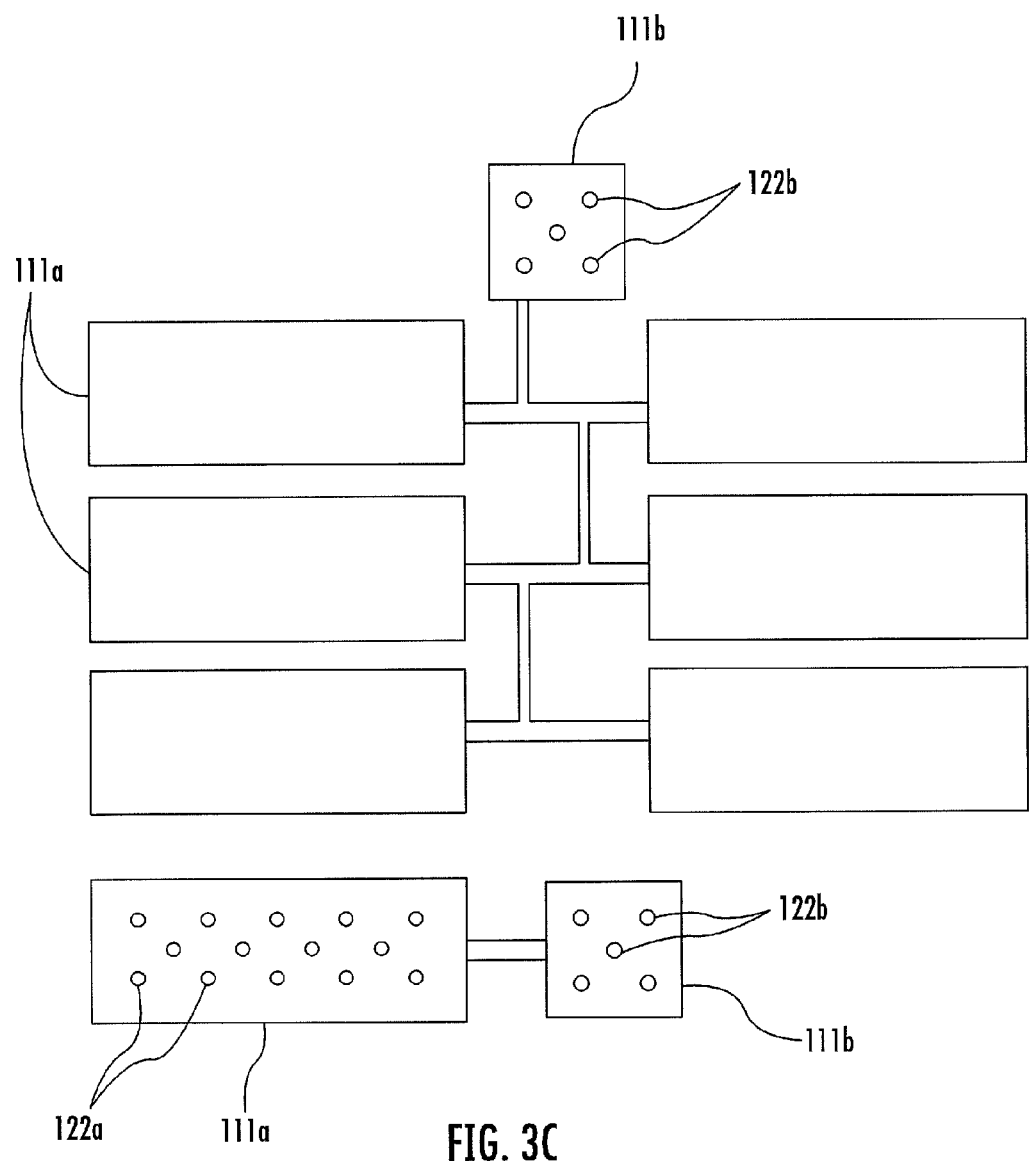

In a modified embodiment of the method discussed above, the first cavity 111a can be connected to the second cavity 111b within the first material layer 110 as shown in FIG. 3A. Specifically, as shown in FIG. 3A through 3C, one or more conduits 115 can be formed within the first material layer 110 to connect the environments within the connected cavities. Again, the first vent holes 122a can have different sizes than the second vent holes 122b such that they seal at different stages of a multi-stage sealing process as discussed above. In this way, even after the first vent holes 122a are sealed, the environment within the first cavity 111a can be changed. In this way, both the first cavity 111a and the second cavity 111b can be sealed while exposed to the second atmosphere. In this configuration, the first cavity 111a and the second cavity 111b can be modeled as two portions of a single cavity within the first material layer 110.

This process can be advantageously used, for example, where direct access to the first cavity 111a through the first material layer 110 is needed or desired (e.g., for etch release of one or more of MEMS devices 101 to be encapsulated therein), but it would be desirable for the interior of the first cavity 111a to be protected from later material deposition steps. In this regard, the first cavity 111a can be considered a "primary" cavity that is sealed during a cleanest of the material deposition process stages (e.g., PECVD Silane oxide), while a "secondary" cavity connected thereto (i.e., second cavity 111b) can remain open such that the final desired pressure within all of the cavities can be determined in a later processing step. In this regard, the second cavity 111b can be configured within the MEMS die 100 to contain no device therein (i.e., nothing for later material deposition steps to damage), or it can contain a device that is not sensitive to such later process steps.

For instance, as shown in FIGS. 3B and 3C, examples of various cavity layouts are shown. In FIG. 3B, for example, a plurality of first cavities 111a (e.g., six cavities in FIG. 3B) are each connected to one another and to a second cavity 111b through a series of conduits 115. In this configuration, all of the first vent holes 122a can be sealed in a first sealing step, but the atmosphere within all of the chambers can still be adjusted, and only when the desired environment is realized, the second vent holes 122b can be sealed to encapsulate all of the connected cavities with that desired environment therein. Similarly, FIG. 3C shows some alternative cavity layouts in which arrays of first cavities 111a are connected to separate second cavities 111b for defining the environmental characteristics within the first cavities 111a after the first cavities are sealed (e.g., by sealing first vent holes 122a).

In any configuration, the second cavities 111b can be designed to not be affected by over deposition. In this way, for example, the first cavities 111a can be sealed under conditions favorable for the manufacture of any devices encapsulated therein (e.g., MEMS 101), and the second cavities 111b can provide an atmospheric venting function. In this way, the process disclosed herein can effectively allow for more freedom in the selection of vent hold locations. In this way, when encapsulating MEMS devices, for example, the vent holes can be selectively designed to be either be positioned above MEMS beams or not, thereby allowing greater control over device parameters of the beam (e.g., $D_{avg}$, $K_{short}$, $K_{long}$). Similarly, the vent holes can be selectively positioned either above or not above a root and/or spring of a beam, which can likewise allow greater control over certain device parameters (e.g., $D_{avg}$, $D_{tip}$). Furthermore, the vent holes can be selectively positioned either above or not above vias, thereby providing greater control over device characteristics such as total interference, capacitor interference, and/or lifetime degradation.

Alternatively, the second cavities 111b can serve as redundant secondary cavity for sealing each of the first cavities 111a. In this way, for example, this redundant cavity can house a "getter" (i.e., a deposit of reactive material that is placed inside a vacuum system, for the purpose of completing and maintaining the vacuum), which may or may not include an active device (e.g., MEMS 101). For example, such a redundant cavity can serve as an isolated reservoir for gettering unwanted constituents such as water. Alternatively or in addition, such a redundant cavity can serve as a catch basin for extraneous material that is deposited through the holes, such as extraneous SA TEOS oxide. In any configuration, the piping between the redundant cavity and the active cavities can serve as a pathway to limit the ingress of contaminants such as water or extraneous materials.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A micro-electro-mechanical systems (MEMS) die comprising:
   a substrate;
   a first material layer positioned on the substrate, the first material layer comprising at least one cavity formed therein;
   a lid layer positioned on the first material layer, the lid layer comprising first vent holes and second vent holes in communication with the at least one cavity;
   a first sealing layer deposited on the lid layer and sealing the first vent holes; and
   a second sealing layer deposited on the lid layer and the first sealing layer, the second sealing layer sealing the second vent holes.

2. The micro-electro-mechanical systems (MEMS) die of claim 1, wherein the lid layer comprises one or more micro-electro-mechanical systems (MEMS) devices positioned on the first material layer.

3. The micro-electro-mechanical systems (MEMS) die of claim 1, wherein the first vent holes are smaller than the second vent holes.

4. The micro-electro-mechanical systems (MEMS) die of claim 1, wherein the at least one cavity comprises at least a first cavity and a second cavity, wherein the first cavity is connected to the second cavity within the first material layer.

5. The micro-electro-mechanical systems (MEMS) die of claim 1, comprising one or more micro-electro-mechanical systems (MEMS) devices positioned within the at least one cavity.

6. A micro-electro-mechanical systems (MEMS) die of claim 1, comprising:
   a substrate;
   a first material layer positioned on the substrate, the first material layer comprising a first cavity and a second cavity that each have one or more openings out of the first material layer;
   a lid layer positioned on the first material layer, the lid layer comprising first vent holes in communication with the first cavity and second vent holes in communication with the second cavity;
   at least one additional cavity having one or more openings out of the first material layer, wherein the lid layers comprises additional vent holes in communication with the at least one additional cavity;
   a first sealing layer deposited on the lid layer and sealing the first vent holes;
   a second sealing, layer deposited on the lid layer and the first sealing layer, the second sealing layer sealing the second vent holes; and
   at least one additional sealing layer deposited on the lid layer, the first sealing layer, and the second sealing layer, the at least one additional sealing layer sealing the additional vent holes.

* * * * *